United States Patent [19]

Schülke

[11] 4,370,158
[45] Jan. 25, 1983

[54] HEAT-TREATING METHOD FOR SEMICONDUCTOR COMPONENTS

[75] Inventor: Karl A. Schülke, Neuberg, Fed. Rep. of Germany

[73] Assignee: Heraeus Quarzschmelze GmbH, Hanau, Fed. Rep. of Germany

[21] Appl. No.: 225,564

[22] Filed: Jan. 16, 1981

Related U.S. Application Data

[63] Continuation of Ser. No. 77,509, Sep. 20, 1979, abandoned.

[30] Foreign Application Priority Data

Oct. 4, 1978 [DE] Fed. Rep. of Germany ....... 2843261

[51] Int. Cl.³ ............................................. C03B 32/00
[52] U.S. Cl. ......................................... 65/32; 65/110; 65/111; 65/117; 148/175
[58] Field of Search ................... 65/32, 100, 111, 117; 148/175

[56] References Cited

U.S. PATENT DOCUMENTS

| 2,711,055 | 6/1955 | Majkrazak et al. | 65/110 |
| 3,445,300 | 5/1969 | Sirtl | 148/175 |
| 3,490,961 | 1/1970 | Frieser et al. | 148/175 |
| 3,682,699 | 8/1972 | Koga et al. | 148/175 X |

FOREIGN PATENT DOCUMENTS 1339665  9/1963  France ..................... 65/32

Primary Examiner—Arthur D. Kellogg
Attorney, Agent, or Firm—Sprung, Horn, Kramer & Woods

[57] ABSTRACT

An improved method for the heat treatment of quartz-glass tubes at temperatures above 1200° C. is disclosed wherein a pressure is maintained within the glass tube which is 3 to 110 mm Hg higher than the pressure on the external surface of the quartz tube over the heated area of the tube for at least the length of time that a temperature of 1200° C. is exceeded. The process is particularly useful for the treatment of quartz-glass tubes within which silicon wafers are disposed for the purpose of diffusing doping agent into silicon wafers or of depositing doped epitaxial layers on silicon wafers.

3 Claims, 1 Drawing Figure

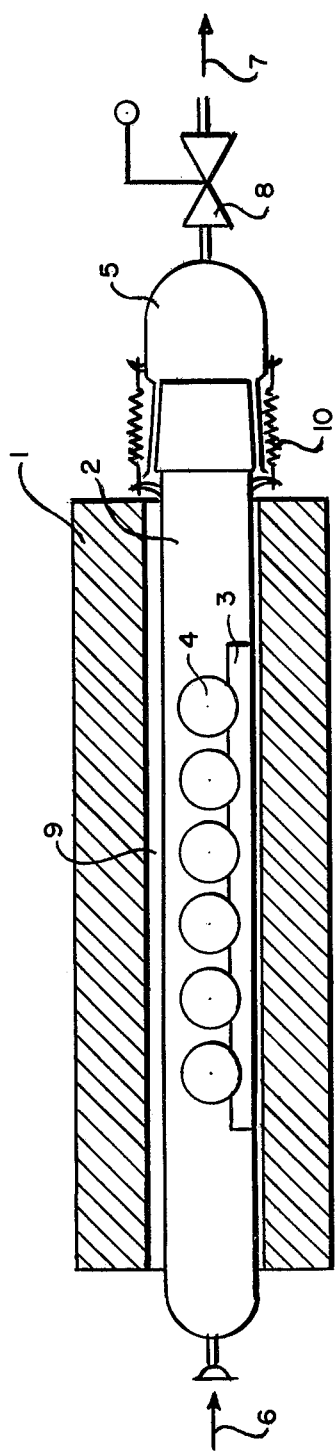

HEAT-TREATING METHOD FOR SEMICONDUCTOR COMPONENTS

This is a continuation, of application Ser. No. 77,509, filed Sept. 20, 1979, now abandoned.

BACKGROUND OF THE INVENTION

1. Field of the Invention

This invention relates to a method for the heat treatment, at temperature above 1200° C., of semiconductor components which are introduced into a quartz-glass tube, a gas stream being conducted through the quartz-glass tube. More especially, this invention simply relates to a manner of maintaining quartz-glass tubes at temperatures above 1200° C. to avoid a deformation of the tubes when they are at temperatures above 1200° C.

2. Discussion of the Prior Art

The use of quartz-glass tubes has long been known for the fabrication of semiconductor components, as, for example, for the purpose of diffusing doping agent into silicon wafers or of depositing doped epitaxial layers on silicon wafers. It has been found that at the elevated temperatures employed the quartz-glass tubes used undergo very considerable plastic deformation. As a result, the racks carrying the semiconductor wafers no longer fit into the quartz-glass tube, which means that the deformed quartz-glass tubes must frequently be replaced with new, underformed tubes.

With a view to overcome this drawback of deleterious deformation, German Pat. No. 1,771,077 discloses quartz-glass tubes intended for use in semiconductor fabricating processes and provided on their external surface with a coating formed by a cohesive, finely crystalline cristobaslite layer. Quartz-glass tubes of this type have proven themselves for many years. However, the manufacture of such quartz-glass tubes requires an additional heat treatment of regular quartz-glass tubes.

In view of the drawback of deformation of quartz-glass tubes, it has also been proposed to use silicon or silicon carbide tubes in their place. (German Auslegsschrift DAS 23 53 411.)

SUMMARY OF THE INVENTION

It is an object of this invention, therefore, to provide a process wherein quartz-glass tubes are heated at temperatures of 1200° C. or more where deformation of the quartz-glass tubes is avoided.

It is a further object of this invention to provide a process which extends the service lifte of quartz-glass tubes such as quartz-glass tubes used in semiconductor fabricating processes.

It is still a further object of this invention to provide an improved process for the diffusing of doping agent into silicon wafers or the depositing of doped epitaxial layers on silicon wafers wherein such process takes place in quartz glass tubes at temperatures above 1200° C.

In accordance with this invention, a process for the heat treatment of a quartz-glass tube at a temperature in excess of 1200° C. is provided which process is characterized in that a pressure is maintained within said quartz-glass tube which is from 3 to 110 mm Hg higher than the pressure on the external surface of the glass tube over the heated area of the tube for at least the period of time that the temperature exceeds 1200° C. in said heated area. Preferably, the internal pressure maintained in the quartz-glass tube is from 4 to 16 mm Hg higher than the pressure on the external surface of the quartz-glass tube over the heated area of the tube.

The method in accordance with the invention offers the advantage that regular quartz-glass tubes, too, can be used in semiconductor fabricating processes since a collapsing of the tubes at the high operating temperatures of 1280° C., for example, is positively prevented by the superatmospheric internal pressure. The method even makes it possible to reduce the wall thickness of the quartz-glass tubes, thus permitting savings in high-grade quartz of up to 30 percent to be achieved.

For the prevention of uncontrolled swelling of the quartz-glass tubes, it has proved advantageous to use quartz-glass tubes whose external surface has been given a shape-retention treatment as described in German Pat. Nos. 1,696,061, 1,771,077 or 2,038,564, for example, the disclosures of which are specifically hereby incorporated herein by reference.

BRIEF DESCRIPTION OF DRAWING

The drawing annexed hereto is a schematic drawing showing a typical process in which a quartz-glass tube is heating at a temperature in excess of 1200° C.

DESCRIPTION OF SPECIFIC EMBODIMENT

Referring to the appended drawing, there is disposed in oven 1 a quartz-glass tube 2. The wafers 4, for example, silicon wafers, to be heat-treated are arranged on a supporting rack 3 inside the tube 2. The rack 3 with the wafers 4 is introduced into and withdrawn from the tube 2 after the cap 5 has been removed. When the temperature inside the tube has been brought to a level above 1200° C. by means of the oven 1, a stream of a gas such as oxygen is fed into the tube as indicated by the arrow 6, said stream exiting from the tube as indicated by the arrow 7. The pressure within the tube 2 is regulated so by means of the valve 8 that in the interior of the tube 2 is from 3 to 110 mm Hg higher than at point 9 outside the tube. On completion of the heat treatment, the cap 5 is removed from the tube 2 after it has sufficiently cooled off, the rack 3 carrying the wafers 4 is withdrawn from the tube, and another rack with wafers to be heat-treated is introduced into the tube. The tube 2 remains in the oven 1 during this discharging and charging operation. The cap 5 is maintained on the tube 2 by means of the spring 10.

The superatmospheric pressure maintained in the interior of the glass tube relevant to the exterior thereof can be maintained with the use of any suitable gas depending upon the purpose for which the quartz-glass tube is undergoing heat treatment at a temperature in excess of 1200° C. Suitable gases which can be employed to maintain this pressure include: helium, argon, nitrogen, hydrochloric acid gas, oxygen, water vapor, air, halogenated hydrocarbon gases, hydrogen.

It is to be understood that the process of this invention is useful in any process in which the quartz-glass tube is the undergo heat treatment at temperatures in excess of 1200° C. One example of such process is in the diffusing of a doping agent into a silicon wafer or in the depositing of doped epitaxial layers on silicon wafers. The gist of the invention resides, however, in the maintenance of a superatmospheric pressure on the internal surface of the quartz-glass tube with respect to the pressure on the external surface such that during such heat treatment deformation of the quartz-glass tube is avoided. Thus, the invention is broadly applicable to other processes in which quartz-glass tubes are heated to temperatures in excess of 1200° C.

What is claimed is:

1. A method of heat-treating, at temperatures above 1200° C., semiconductor components which are introduced into a quartz-glass tube, a gas stream being conducted through the quartz-glass tube, wherein there is maintained in the interior of the quartz-glass tube, at least for the length of time that the temperature of 1200° C. is exceeded, a pressure which is from 3 to 110 mm Hg higher than the pressure on the external surface of the quartz-glass tube over the heated area of the tube.

2. A method according to claim 1 wherein the internal pressure which is maintained in the quartz-glass tube is from 4 to 16 mm Hg higher than the pressure on the external surface of the quartz-glass tube.

3. A method according to claim 1 or claim 2 wherein quartz-glass tubes are employed whose external surface has been given a shape-retention treatment.

* * * * *